(12) United States Patent
Ortleb et al.

(10) Patent No.: US 8,323,471 B2
(45) Date of Patent: Dec. 4, 2012

(54) AUTOMATIC DEPOSITION PROFILE TARGETING

(75) Inventors: Thomas Ortleb, Dresden (DE); Markus Nopper, Dresden (DE); Dirk Wollstein, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 966 days.

(21) Appl. No.: 12/034,744

(22) Filed: Feb. 21, 2008

(65) Prior Publication Data
US 2009/0000950 A1 Jan. 1, 2009

(30) Foreign Application Priority Data
Jun. 29, 2007 (DE) .................. 10 2007 030 052

(51) Int. Cl.
C25D 21/12 (2006.01)
C25D 5/00 (2006.01)
C25D 5/02 (2006.01)
C25C 14/00 (2006.01)

(52) U.S. Cl. .............. 205/84; 205/82; 205/96; 205/123; 204/298.03

(58) Field of Classification Search ............ 205/82, 205/84
See application file for complete search history.

(56) References Cited

U.S. PATENT DOCUMENTS

| | | | |
|---|---|---|---|
| 6,630,360 B2 | 10/2003 | Christian et al. | 438/5 |
| 6,926,816 B2 * | 8/2005 | Sano et al. | 205/81 |
| 6,969,672 B1 | 11/2005 | Hewett et al. | 438/584 |
| 2002/0165636 A1 * | 11/2002 | Hasan | 700/121 |
| 2002/0192944 A1 * | 12/2002 | Sonderman et al. | 438/637 |
| 2004/0225377 A1 * | 11/2004 | Kokotov et al. | 700/1 |
| 2005/0032459 A1 * | 2/2005 | Surana et al. | 451/5 |
| 2005/0067290 A1 * | 3/2005 | Bonkass et al. | 205/84 |
| 2006/0000716 A1 * | 1/2006 | Wilson et al. | 205/82 |
| 2006/0193992 A1 * | 8/2006 | Bonkass et al. | 427/430.1 |

FOREIGN PATENT DOCUMENTS

| | | |
|---|---|---|
| DE | 102005009024 | 9/2006 |
| WO | 02101817 | 12/2002 |

OTHER PUBLICATIONS

Butler, S. W., York, R., Bennett, M. H. and Winter, T. 1999. Semiconductor Factory Control and Optimization. Wiley Encyclopedia of Electrical and Electronics Engineering.*
Official Communication Dated Mar. 20, 2008 for Serial No. 102007030052.4-43.
Translation of Official Communication from German Patent Office for German Patent Application No. 10 2007 030 052.4 dated Jun. 20, 2011.

* cited by examiner

Primary Examiner — Jonathan Johnson
Assistant Examiner — Brian W Cohen
(74) Attorney, Agent, or Firm — Williams, Morgan & Amerson, P.C.

(57) ABSTRACT

A method of automatic deposition profile targeting for electrochemically depositing copper with a position-dependent controllable plating tool including the steps of depositing copper on a patterned product wafer, measuring an actual thickness profile of the deposited copper and generating respective measurement data, feeding the measurement data to an advanced process control (APC) model and calculating individual corrections for plating parameters in the position-dependent controllable plating tool.

17 Claims, 3 Drawing Sheets

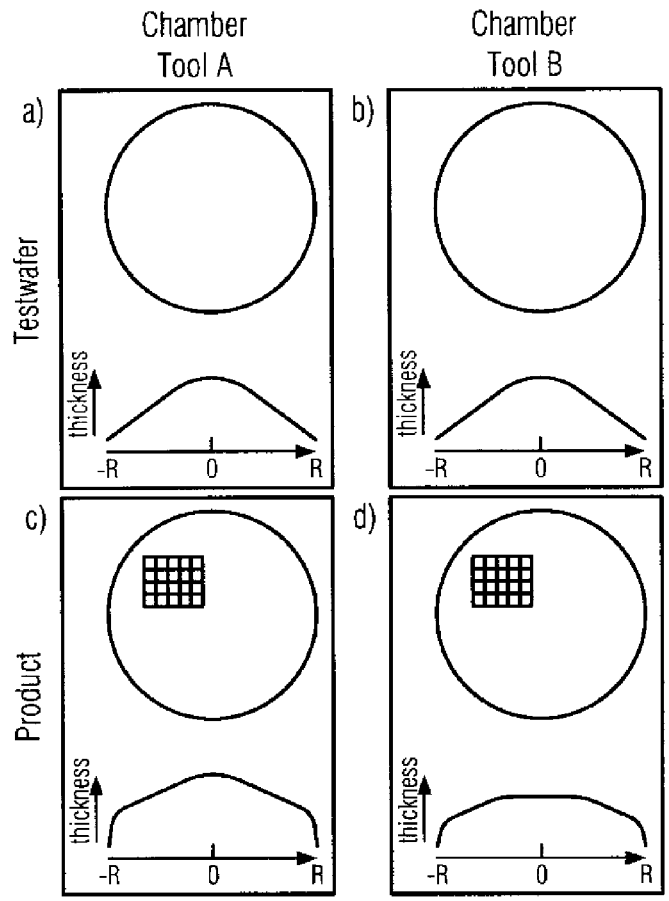
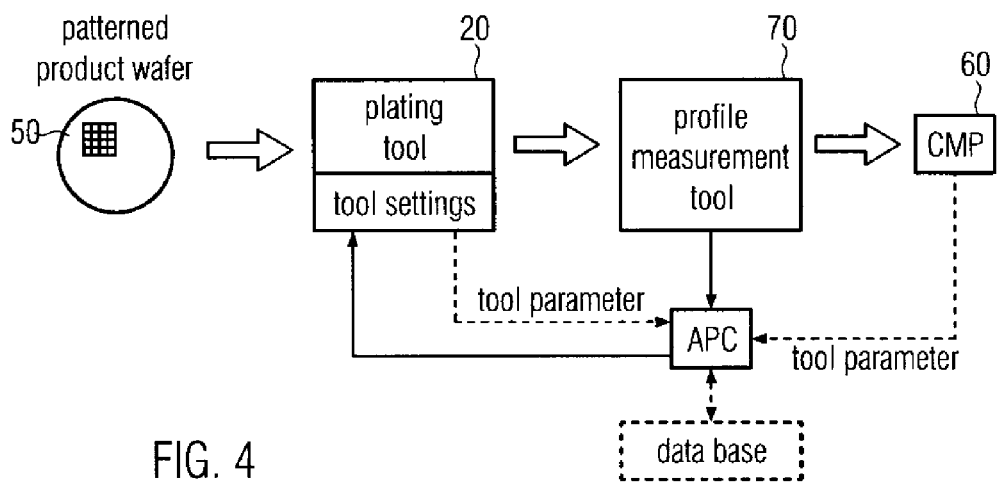
FIG. 3
FIG. 4

AUTOMATIC DEPOSITION PROFILE TARGETING

BACKGROUND OF THE INVENTION

1. Field of the Invention

The present disclosure generally relates to the process of depositing a material on a substrate using a position-dependent controllable deposition tool, and, more particularly, to automatic deposition profile targeting for depositing copper to a predetermined deposition profile.

2. Description of the Related Art

The demand for higher integration, higher clock frequencies and smaller power consumption in microprocessor technology leads to a new chip interconnection technology, using copper instead of aluminum for chip wiring. Since copper is a better conductor than aluminum, chips using this technology may have smaller metal components and use less energy to pass electricity through them. These effects lead to a high performance of the integrated circuits.

The transition from aluminum to copper, however, required significant developments in fabrication techniques. Since volatile copper compounds do not exist, copper cannot be patterned by photoresist masking and plasma etching, such that a new technology for patterning copper had to be developed, which is known as a copper damascene process. In this process, the underlying silicon oxide insulating layer is patterned with open trenches where the conductor should be filled in. A thick coating of copper that significantly overfills the trenches is deposited on the insulator and chemical mechanical planarization (CMP), also known as chemical mechanical polishing, is used to remove the copper to the top level of the trench.

Since copper may not be deposited efficiently by physical vapor deposition, for example, by sputter deposition, with a layer thickness on the order of 1 μm and more, electroplating of copper and copper alloys is the currently preferred deposition method of forming metallization layers. Although electroplating of copper is a well-established technique, reliably depositing copper over large diameter substrates, having a patterned surface including trenches and wires, is a challenging task for process engineers. At a first glance, it appears to be advantageous that the metal thickness profile across the substrate surface may be formed as uniformly as possible. However, post-plating processes may require a differently shaped profile so as to assure proper device functionality of the completed integrated circuits. Currently, there is no effective copper dry etching method because of problems removing low volatility copper compounds. Presently, chemical mechanical polishing (CMP) is used for removing excess copper. Since the CMP process is per se a highly complex process frequently exhibiting an intrinsic process non-uniformity, i.e., a non-uniform removal rate across the substrate surface, it may be preferable to adapt the metal thickness profile to the post-plating process to achieve in total an improved process uniformity after the completion of the post-plating process. Therefore, electroplating tools are often configured so as to allow a variation of the metal profile, for instance by using multiple anodes on an ECD (electrochemical deposition) copper plating tool.

All current systems were using unpatterned test wafers to adjust the plating profile. FIG. 1 illustrates an adjustment scheme for adjusting a plating profile. In FIG. 1, an unpatterned test wafer 1 is coated in a plating tool 2 with copper. A four-point-probe 3 measures a copper profile of the unpatterned coated wafer. A controller 4 compares the measured data with a profile target and calculates corrections if the measured copper profile does not match with the profile target. The controller 4 then updates the tool settings of the plating tool 2. The profile target inputted to the controller 4 considers chemical mechanical polishing characteristics of the chemical mechanical polishing (CMP) tool. The plating tool 2 is an electroplating system having a plurality of individually drivable anode portions, thereby defining a multiple anode configuration. A substrate holder may be configured as a cathode and, by individually adjusting each anode current, a plating profile across a substrate surface may be controlled. The tool settings are adjusted in repetitively running test wafers as long as the difference between the profile target and the measured profile falls below a predetermined value.

Once appropriate tool settings have been found, a patterned product wafer may be plated with copper. This is exemplified in FIG. 2. Copper is electrochemically deposited with the plating tool 2 onto a patterned product wafer 5. The plating tool settings for base shaping of the deposition profile for compensating chamber characteristics is done by qualification of unpatterned test wafers as described in connection with FIG. 1. Constant offsets are applied to these settings in order to take into consideration profile deviations due to the patterns on the product wafer. In case of a multi-anode plating tool, a constant offset is applied to each of the anodes of the plating tool.

After plating the patterned product wafer, it is treated with chemical mechanical polishing 6 in order to finish the copper wirings. By polish endpoint tracing 7, or other adequate measurements, for instance, motor current control, post polish thickness or sheet resistance measurements, chemical mechanical polishing 6 parameters may be adjusted to appropriately remove excess copper. Since the plating tool settings are fixed once appropriate settings have been found, this method is designated as a static method.

It has to be noted that the characterization of the process illustrated in FIG. 2 needs to be done individually per layer and product if there are significant differences in percentages of open areas, die sizes and wafer stepping. All these efforts lead to a consumption of a certain amount of wafers to find the right shaping, which adds cost and cycle time. The CMP process is very consumable-dependent. Therefore, a one-time snap shot is not always relevant for the whole population of product wafers. Additionally, there is an individual operator and/or engineering dependence. A further drawback of the static method is that process fluctuations cannot be compensated for. For instance, the electrolyte concentration may change with time which leads to a change of the plating profile. Anodes or cathodes may corrode with time such that the plating settings become inadequate. Chemical mechanical polishing conditions may change due to deterioration of the tool characteristics. As a consequence, additional qualification runs of unpatterned test wafers have to be carried out in order to re-adjust the tool settings, i.e., the plating tool and the CMP tool.

FIG. 3 exemplifies some of these drawbacks. FIG. 3a (left hand upper part) shows an unpatterned test wafer 1 which has been coated with copper in a chamber with tool A such that its deposition profile matches with the target profile. FIG. 3b (right hand upper part) shows the same with a different tool B. FIG. 3c (left hand lower part) shows a patterned product wafer 5 which has been coated with copper in chamber tool A using the same settings as in FIG. 3a. As can be seen in FIG. 3c, the thickness profile is different as shown in FIG. 3a due to a chamber offset and the patterns on the product wafer 5. Chamber offset means that the product wafer is not coated immediately after a test wafer run such that plating conditions like consumable status and chamber status due to aging may have changed. Also the patterns on the product wafer, like trenches and their width and depth, may influence the electrical field that is necessary for the plating process. FIG. 3d (right hand lower part) shows another product wafer 5 which has been coated in chamber tool B with copper. Even if the patterns on the product wafer are the same as in FIG. 3c, and even if the profile of a test wafer is the same in chamber tool B and chamber tool A, the profile on the product wafer is different in FIGS. 3d and 3c due to plater and chamber offsets and wafer patterns.

In view of the global market forces to offer high quality products at low prices, it is thus important to improve yield and process efficiency to minimize production costs. In manufacturing modern integrated circuits, 500 or more individual processes may be necessary to complete the integrated circuit, wherein failure in a single process step may result in a loss of the complete integrated circuit. It is therefore crucial for manufacturing integrated circuits that each individual step reliably has the desired result, thereby requiring as little as possible resources.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a method of automatic deposition profile targeting that leads to an automatic and self-sufficient process of plating targeting or other deposition targeting of metal or dielectrics on given deposition and chemical mechanical polishing (CMP) equipment.

In particular, there is provided a method of automatic deposition profile targeting for depositing a material with a position-dependent controllable deposition tool, for instance, a multi-anode plating tool, but not limited thereto, such that the deposition profile matches with polishing characteristics of the CMP tool in order to achieve appropriate copper wiring structures in semiconductor chip technology. The method comprises the steps of depositing material, e.g., copper, on a patterned product wafer, measuring an actual thickness profile of deposited material and generating respective measurement data, feeding the measurement data to an advanced process control model and calculating individual corrections for deposition parameters in the position-dependent controllable deposition tool. There is thus provided an objective and fast method for an automatic and product measurement based deposition shaping, which does not require manual shaping experiments. The method provides both dynamically targeting deposition profile during running of a production process and automatically finding plating process recipes for a new layer/product combination which match the profile targets.

As soon as a process recipe for the product/layer combination has been found, the advanced process control (APC) is able to collect process relevant data and provides dynamically adjusted product/layer correction factor optimizing for plating tool settings. The advanced process control may further provide improved initial settings for new products/layer combinations such that time for adjusting a new process for a new product/layer combination may be saved. In addition, the advanced process control provides a user-friendly set of parameters for documentation and charting of relevant parameters to avoid an uncontrolled APC black box behavior.

According to one illustrative embodiment, the advanced process control includes models which can predict plating behavior. For instance, there may be included a model describing a dependency between a deposition profile target and a chemical mechanical polishing (CMP) tool characteristic and a CMP tool history, a model of a dependency between a deposition profile and underlying product wafer structures, a model of a dependency between a deposition profile and plating tool characteristics and chamber characteristics, a model of a dependency between a deposition profile and a plating tool history and a chamber history, and a model describing a relation between an unpatterned test wafer and a patterned product wafer. Thus, accurate initial settings for a new product layer combination may be calculated and process fluctuations may be compensated for more quickly and accurately.

According to another illustrative embodiment, the corrections are calculated based on a difference between an actual deposition profile and a target deposition profile. Furthermore, the APC model is repeatedly recalculated and updated based on the calculated corrections until the difference between the actual deposition profile and the target deposition profile is smaller than a predetermined value. Subsequently, a new set of model data is implemented in the APC including relevant process parameters selected at least from the group comprising pattern density, etch depth, trench width, wafer stepping, material and crystal orientation of underlayer, consumable status, hardware settings, and chamber geometry. This leads to a self consistent method of profile targeting which does not require test measurements.

According to a further illustrative embodiment, a virtual test wafer target and a virtual test wafer profile is calculated from the measured product wafer, and process parameter corrections may be calculated based on a difference between the virtual test wafer profile and the virtual test wafer product. A particular advantage is that calculating virtual test wafer profiles and virtual test wafer targets reduces the data to a user friendly and intuitive format. A further advantage is that the used models may be validated and adjusted by processing a test wafer.

In yet another illustrative embodiment, there is provided a system for automatic deposition profile targeting according to the above-described methods comprising a position-dependent controllable plating tool for electrochemical depositing copper, a measurement tool to determine a deposition profile of deposited copper, a chemical mechanical polishing tool (CMP) and an advanced process controller connected with the measurement tool and the position-dependent controllable plating tool, wherein at least one of the following models is implemented in the advanced process controller: a model of a dependency between a deposition profile target and CMP tool characteristics and CMP tool history; a model of a dependency between a deposition profile and underlying product wafer structures; a model of a dependency between a deposition profile and plating tool characteristics and chamber characteristics; a model of a dependency between a deposition profile and a plating tool history and chamber history; and a model describing a relation between an unpatterned test-wafer and a patterned product wafer, wherein the advanced process controller is configured to calculate a virtual test wafer profile and a virtual test wafer target from measured profile of a product wafer, wherein the advanced process controller is configured to calculate process parameter corrections based on a difference between the calculated virtual test wafer profile and the calculated virtual test wafer target, for updating a process recipe of the plating tool, wherein the corrections are calculated based on a difference between an actual deposition profile and a target deposition profile, wherein the APC model is repeatedly recalculated and updated based on the corrections until the difference between the actual deposition profile and the target deposition profile is smaller than a predetermined value, and wherein a new set of model data is implemented in the APC, including relevant process parameters selected from at least any one of the group comprising pattern density, etch depth, trench width, wafer stepping, material and crystal orientation of underlayer, consumable status, hardware settings, and chamber geometry.

BRIEF DESCRIPTION OF THE DRAWINGS

The disclosure may be understood by reference to the following description taken in conjunction with the accompanying drawings, in which like reference numerals identify like elements, and in which:

FIG. 3 illustrates drawbacks of a static targeting method according to FIGS. 1 and 2;

FIG. 4 illustrates schematically the method of automatic deposition profile targeting according to the present disclosure.

Figure 1:
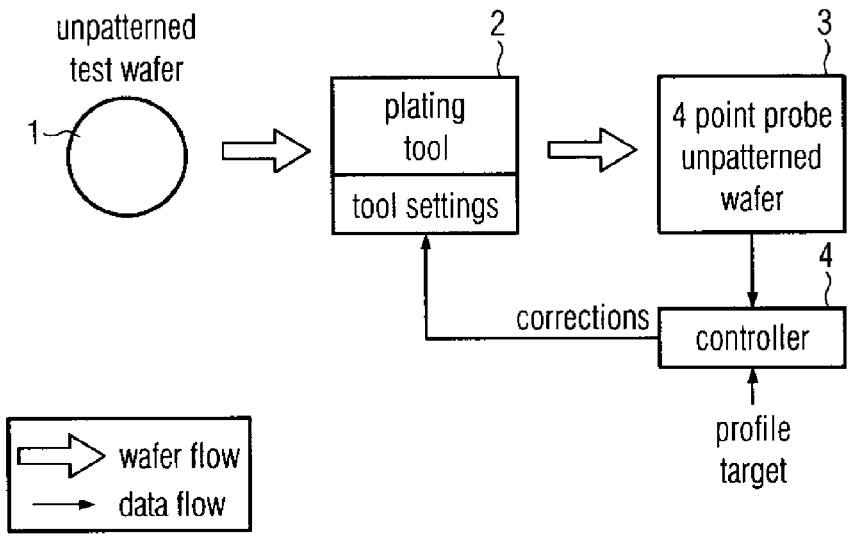
FIG. 1 illustrates a method for adjusting tool settings of a plating tool by use of an unpatterned test wafer according to the state of the art.
Figure 2:
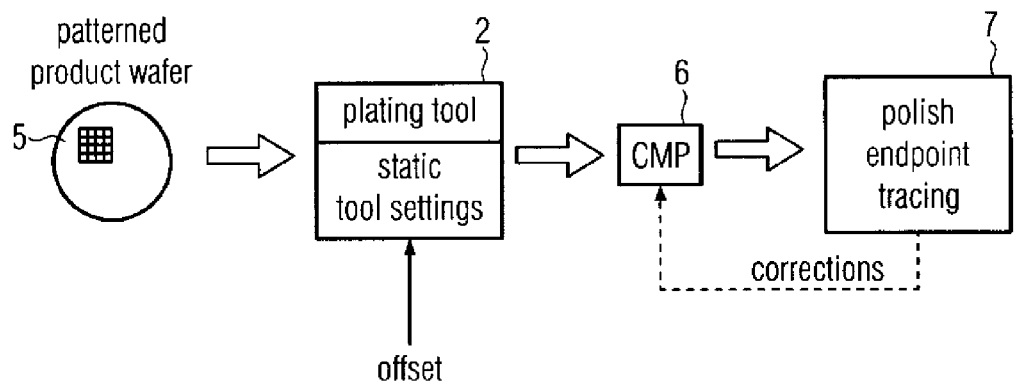
FIG. 2 illustrates the processing of a patterned product wafer with a plating tool adjusted with the settings determined in the method according to FIG. 1.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It is to be noted that the detailed description will refer to electroplating of a metal such as copper, on substrates such as those typically used in semiconductor fabrication, since the present disclosure is particularly useful in a process sequence with sensitive post-plating processes, such as chemical mechanical polishing (CMP). It will be readily appreciated, however, that the present disclosure is applicable to any plating process with an externally impressed current (electroplating), of any types of substrates requiring a specified deposition profile on a substrate surface or a portion thereof. Moreover, although the description refers to a plating tool, this method can also be applied to any deposition tool which can control deposition profile and which requires post-deposition processes such as etching and polishing. Thus, the present disclosure is to be understood as not being restricted to a specific type of deposition tool unless depositions are explicitly set forth in the claims.

One particular feature of this disclosure is that an actual thickness profile of deposited material on a product wafer is measured and corrections for the deposition tool is calculated on the basis of an advanced process control (APC) model in order to compensate production line fluctuations or in order to find a parameter set for the deposition tool such that the deposition profile target is met. Thus, no test wafers are required to adjust the tool settings for a particular layer or product. The method adjusts the tool settings in a self-consistent process until the intended profile target is achieved. Further, by tracking and storing production parameters, the advanced production control model may be continuously improved and updated such that the settings for a particular deposition target may be found quickly and more accurately. Moreover, the collected data may be presented in a more user friendly way of virtual test wafer targets and virtual test wafer profiles which may be used in turn to validate the APC models.

FIG. 4 illustrates the method of this disclosure. A patterned product wafer 50 is coated with copper in a plating tool 20. Subsequently, the deposition profile of the deposited copper is measured in a profile measurement tool 70. If the actual measured copper profile matches with the target profile, the product wafer may be forwarded to the chemical mechanical polishing tool 60 for further processing. The measurement data of the profile measurement tool are fed to the advanced process control 80 which may readjust the tool settings of the plating tool 20 if necessary. The APC 80 may optionally collect the tool parameters from the plating tool 20 and the CMP tool 60. Further, the APC 80 may store the measured and the calculated parameters in a data base.

The plating tool 20 may be a typical conventional electroplating system including a reactor vessel with a plurality of individually drivable anode portions thereby defining a multiple anode configuration. The plating tool 20 may be a so-called fountain type reactor, in which an electrolyte solution is directed from the bottom of the reactor vessel to the top side and is then re-circulated by a pipe connecting an outlet with a storage tank, which in turn is connected to an inlet provided as a passage through the anode. The electroplating system may further comprise a substrate holder that is configured to support a substrate, such as the patterned product wafer 50, so as to expose a surface of interest to the electrolyte. Moreover, the substrate holder may be configured to connect as a cathode. In a typical configuration, a thin current distribution layer, typically provided by sputter deposition, is formed on the surface of the substrate 50 that will receive the metal layer. After mounting the substrate on the substrate holder and connecting the current distribution layer with a power source via the substrate holder, an electrolyte flow is created within the reactor vessel by activating a pump. By applying appropriate voltages between the multiple anode configuration and the cathode, copper is deposited on the product wafer 50 depending on respective currents between the cathode and each of the plurality of anode portions. The deposition of metal on the substrate 50 is determined by the flow of electrolyte and the arrangement of the multiple anode configuration, since the local deposition rate of metal on a specific area of a surface of the substrate depends on the number of ions arriving at this area. The resulting thickness profile is determined not only by the individual currents flowing through any one of the plurality of anodes, but is also determined by the characteristics of the reactor vessel, the electrolyte solution, and the characteristics of the wafer itself. Generally, the plating profile may be described by the following formula 1:

$$M(r) = S(r) \cdot I(r) \cdot t \tag{1}$$

M(r) is the thickness profile of the deposited copper. Please note that in this case a circular symmetry is assumed wherein the thickness of the copper depends only on the radius r in a polar co-ordinate system. As a person skilled in the art would appreciate, limiting the dependency only on the radial coordinate serves only for illustrative purposes. As the person skilled in the art knows, an angular dependence of the thickness profile in case of a polar coordinate system is also possible. I(r) designates the local current at the coordinate r. t is the time of current flow. I(r)·t designates the total deposited charge Q at the radius r. Although it is assumed in a first approach that all of the total charge Q is deposited at the respective radius r, the real situations showed that there are many influences which disturb the deposition of the copper having the charge Q at the particular radial position r. This influence is taken into consideration with a correction factor, a so-called sensitivity function S(r) which subsumes the aforementioned reactor vessel and substrate characteristics.

The control over the deposition profile M(r) is achieved by the particular multi-anode configuration which allows local adjustment of the deposition current due to the configuration of the anodes. If, for instance, the anodes are arranged in a circular shape at different radii, the deposition profile M(r) may be influenced radius-dependent.

The total amount of deposited charges/copper is given according to formula 2:

$$Q = \int_{r=-R}^{+R} I(r) \cdot t \cdot dr = I_{total} \cdot t \tag{2}$$

Since, in a multi-anode configuration, the total current $I_{total}$ is realized by the sum of the individual currents of the respective anodes, the total current $I_{total}$ may be described as in the following formula 3:

$$I_{total} = I_{Anode1} + I_{Anode2} + I_{Anode3} + \ldots \tag{3}$$

Formula 2 may then be written in a discreet form according to formula 4:

$$Q = \sum_i I_{Anodei}(r_i) \cdot t \tag{4}$$
$$= (I_{Anode1}(r_1) + I_{Anode2}(r_2) + I_{Anode3}(r_3) + \ldots) \cdot t$$

Since the deposited charge/copper is not completely under the control of a respective anode and its position, which is subsumed with the sensitivity function S(r), the currents of respective anodes have to be corrected. Formula 5 gives a more general expression for external influences:

$$S(r) = S(r; A_1(r), A_2(r), \ldots) \tag{5}$$

S(r) represents the aforementioned sensitivity function for particular positions r, indicating the affinity of particular positions r for depositing a charged particle such as copper. $A_1(r)$ and $A_2(r)$ may represent, for instance, electrolyte concentration at a particular position r depending on, for instance, consumable status and flow profile of the electrolyte. Also, pattern density, etch depth, trench width, wafer stepping, material and crystal orientation of an underlayer on the substrate may have an influence on the sensitivity parameter S(r). The sensitivity factor requires a correction of each of the currents corresponding to particular anodes. This may be, for instance, considered by applying a particular correction factor to each anode current as exemplified, for instance, with formula 6:

$$I_{total} = I_{Anode1} \cdot cf1 + I_{Anode2} \cdot cf2 + I_{Anode3} \cdot cf3 + \ldots \tag{6}$$

Formula 6 indicates that a correction factor cf1, cf2, cf3 . . . is applied to the respective anode current $I_{Anode1}$, $I_{Anode2}$, $I_{Anode3}$ . . . in order to achieve the intended deposition profile.

It has to be understood that the corrections of the anode current is not restricted to a correction factor, but an offset may also be applied individually to each anode current. Further, the described plating tool is not limited to a fountain-type plating tool. Other types of plating tools such as electrolyte baths and the like may be used as well. Thus, the present disclosure is to be understood as not being restricted to a specific type of electroplating tool.

The subsequent measurement with the profile measurement tool 70 is carried out by any suitable measurement tools, e.g., Rudolf MetaPulse, Jordan Valley or AMS. The respective measurement data are fed to the APC 80, which have implemented models generally describing the sensitivity factor S(r) (see formula 5).

Figure 5:
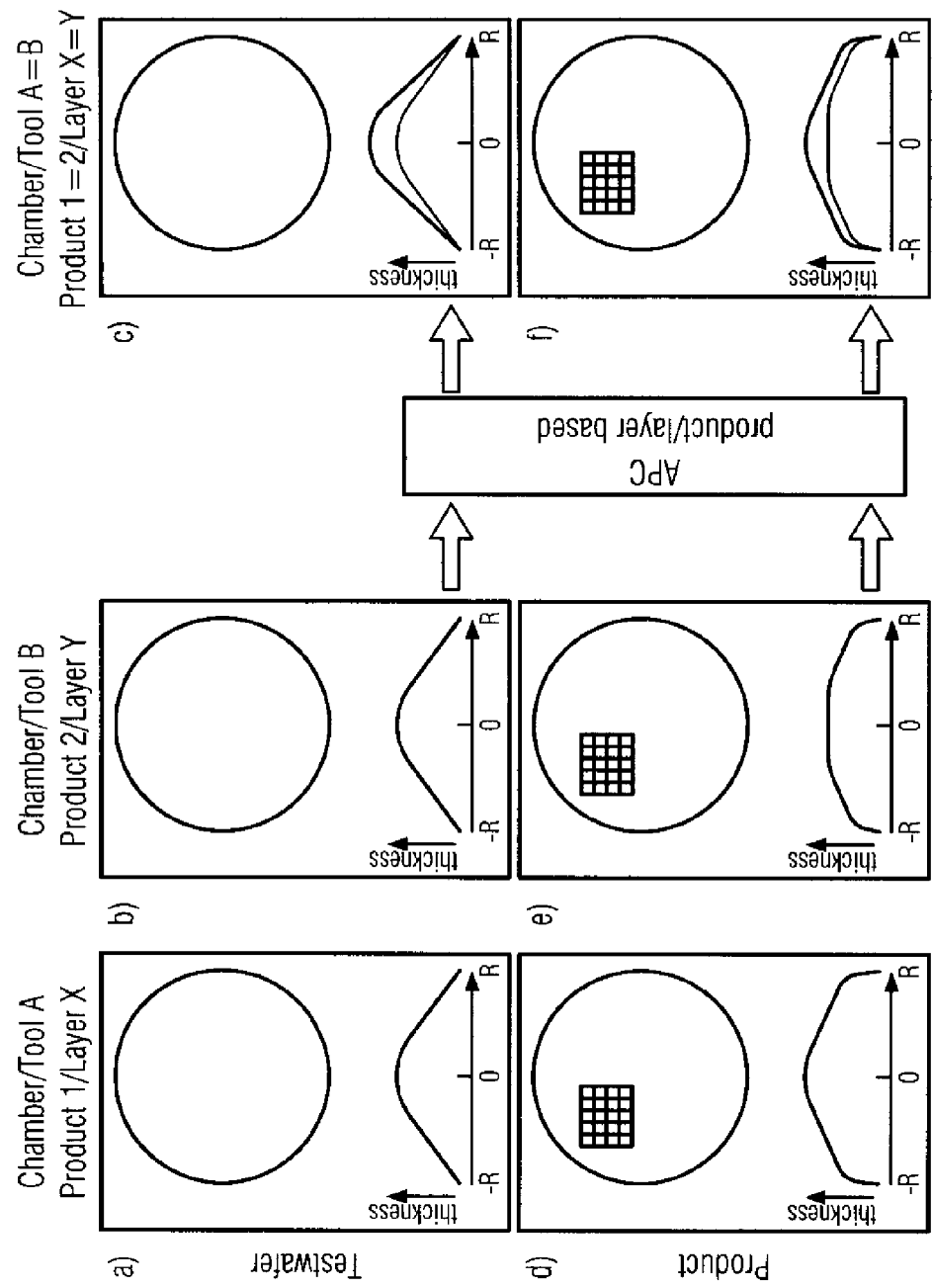
FIG. 5 illustrates the advantages of the method schematically illustrated in FIG. 4.

FIG. 5 illustrates some of the advantages of the present disclosure. Similar to FIG. 3, FIG. 5a shows an unpatterned test wafer which has been coated with copper in a chamber with tool A such that its deposition profile matches with the target profile. FIG. 5b shows the same with a different tool B. FIG. 5d shows a patterned product wafer which has been coated with copper in chamber tool A using the same settings as in FIG. 5a. As can be seen in FIG. 5d, the thickness profile is different than that as shown in FIG. 5a due to a chamber offset and the patterns on the product wafer. FIG. 5e shows another product wafer patterns different than that in FIG. 5d and which has been coated in chamber tool B with copper. All data are collected and processed in the APC. This is illustrated with FIG. 5c and 5f. FIG. 5c and 5f symbolizes how the APC calculates process models based on measurement data. Thus, the APC may provide appropriate corrections for adjusting anode currents.

According to the disclosure, the APC may be used in two different modes.

First Operating Mode:

In the first operating mode, the APC is continuously active and uses the measurement data from the profile measurement tool 70 to adjust the plating tool settings continuously during successively processed substrates. An example of the method is given as follows.

A substrate coated with copper by the plating tool 20 is measured with the profile measurement tool 70. If the APC 80 detects that the actual copper profile is different from the profile target, the APC calculates a correction of the tool settings, i.e., corrections for each of the anode currents $I_{Anode1}$, $I_{Anode2}$, $I_{Anode3}$ on the basis of formula 1. For this purpose, a discrete version of formula 1 has to be implemented in the APC 80.

More concretely, formula 1 has been implemented in a discrete form as exemplified in formula 7:

$$\begin{pmatrix} M_{r1} \\ M_{r2} \\ M_{r3} \end{pmatrix} = \begin{pmatrix} S_{r1,1} & S_{r1,2} & S_{r1,3} \\ S_{r2,1} & S_{r2,2} & S_{r2,3} \\ S_{r3,1} & S_{r3,2} & S_{r3,3} \end{pmatrix} \cdot \begin{pmatrix} I_{r1} \\ I_{r2} \\ I_{r3} \end{pmatrix} \cdot t \qquad (7)$$

In formula 7, it is assumed that the plating tool has three anodes at a the radial position r1, r2 and r3. The respective anode currents are designated as $I_{r1}$, $I_{r2}$ and $I_{r3}$. The thickness of the deposited copper at a respective location r1 is designated as $M_{r1}$. The thickness of the copper at the anode locations r2 and r3 are designated accordingly as $M_{r2}$ and $M_{r3}$. It has to be noted that, in this illustrative example, only three thickness positions are considered, namely at r1, r2 and r3. The person skilled in the art knows, however, that the number of thickness positions and the number of anodes need not be the same. For instance, the model may be extended to consider four electrodes and, for instance, ten thickness profile locations M. In this case, vector M (see formula 8) has ten elements and vector I (see formula 8) has four elements.

$$M = S \cdot I \cdot t \qquad (8)$$

Formula 8 shows the matrix notation of formula 7 in a short vector notation. The parameter t indicates the time during which the current I flows.

The matrix S takes into consideration corrections due to chamber and tool characteristics and substrate characteristics as already outlined above. For instance, if there would be no influence from the chamber, the electrolyte concentration, the flow conditions or the pattern density on the substrate, the matrix S would be the unity matrix. That means that current $I_{r1}$ deposits copper only at the position r1 having the thickness $M_{r1}$. In this case, in formula 7, the values $S_{r1,1}$, $S_{r2,2}$, and $S_{r3,3}$ have the value 1 and the remainder elements are 0. On the other hand, if, for instance, the electrolyte flow transports charges from anode 1 (current $I_{r1}$) to the locations r1, r2 and r3, the matrix S is no longer a diagonal matrix. If we assume, for instance, that 50% of $I_{r1}$ deposits at $M_{r1}$, 25% of $I_{r1}$ deposits at $M_{r2}$ and 25% of $I_{r1}$ deposits at $M_{r3}$, the component $S_{r1,1}$ may be set to the value of 0.5, the matrix component $S_{r2,1}$ may be set to 0.25 and the matrix component $S_{r3,1}$ may be set to the value 0.25. It has to be noted that, in the above example, the values of the matrix S components are only relative values exemplifying the principle and do not consider absolute deposition values.

If the APC 80 recognizes a difference $\Delta M$ between the actual measured profile and the target profile, the APC may calculate corrections of the anode currents according to formula 9:

$$\begin{pmatrix} \Delta I_{r1} \\ \Delta I_{r2} \\ \Delta I_{r3} \end{pmatrix} \cdot t^{-1} = \begin{pmatrix} S_{r1,1} & S_{r1,2} & S_{r1,3} \\ S_{r2,1} & S_{r2,2} & S_{r2,3} \\ S_{r3,1} & S_{r3,2} & S_{r3,3} \end{pmatrix}^{-1} \cdot \begin{pmatrix} \Delta M_{r1} \\ \Delta M_{r2} \\ \Delta M_{r3} \end{pmatrix} \qquad (9)$$

In formula 9, $\Delta I_{r1}$, $\Delta I_{r2}$ and $\Delta I_{r3}$ are the correction values which have to be applied as an offset to the anode currents. The values $\Delta M_{r1}$, $\Delta M_{r2}$ and $\Delta M_{r3}$ are the measured differences between the actual thickness and the targeted thickness at the positions r1, r2 and r3. Matrix $S^{-1}$ in formula 9 is the inverse matrix of S in formulae 7 and 8. Formula 10 again shows the short vector notation of formula 9.

$$\Delta I \cdot t^{-1} = S^{-1} \cdot \Delta M \qquad (10)$$

In the continuous operation mode (first operating mode), the values for matrix S are given. With the given matrix S, even small process fluctuations may be compensated for in successively processed substrates.

The determination of the matrix values S and start values for anode currents is carried out in the profile targeting mode (second operating mode), which is explained in more detail below.

Second Operating Mode:

In the profile targeting mode, two situations have to be distinguished. In the first situation, there already exists a database for a plurality of process situations. The database may be incorporated in the form of an expert system containing a set of stored data, for instance, measurement data, such as pattern density for a plurality of products and layers, chamber characteristics, tool settings and profile measurement data, or this database may already be implemented in the advanced process control model in the form of, for instance, a sensitivity matrix S (see formulae 5, 7, 8, 9 and 10). The representation of a plurality of data sets in the form of a single matrix may be considered as a data reduction which has the advantage that no additional storage capacity has to be provided. It has to be noted that the database may comprise a plurality of sensitivity matrices, each of them corresponding to a particular product/layer combination including relevant process and equipment parameters.

In a particular case where a new layer of a new product has to be produced, certain initial values have to be inputted in order to determine appropriate start values for the plating process. Such values may be characteristics of the substrate, such as pattern density, etch depth, trench width, wafer stepping, material and crystal orientation of underlying materials and the like. Further parameters could be chamber characteristics such as flow geometry for the electrolyte, consumable status-like concentration of electrolyte, electrode condition such as electrode history and condition concerning corrosion and the like. Further, a target profile has to be inputted into the APC. The APC may look for appropriate data sets in the database which match with the inputted values as far as possible and calculates with the found sensitivity matrix initial settings for the anode currents by use of a mathematical model according to formula 11, which corresponds to an inverse of formula 7.

$$\begin{pmatrix} I_{r1} \\ I_{r2} \\ I_{r3} \end{pmatrix} \cdot t^{-1} = \begin{pmatrix} S_{r1,1} & S_{r1,2} & S_{r1,3} \\ S_{r2,1} & S_{r2,2} & S_{r2,3} \\ S_{r3,1} & S_{r3,2} & S_{r3,3} \end{pmatrix}^{-1} \cdot \begin{pmatrix} M_{r1} \\ M_{r2} \\ M_{r3} \end{pmatrix}_{target} \quad (11)$$

In formula 11, $I_{r1}$, $I_{r2}$ and $I_{r3}$ designate respective initial values for anode currents. $M_{r1}$, $M_{r2}$ and $M_{r3}$ designate the target thicknesses of the copper at the anode locations r2, r2 and r3.

The better the model is, the better are the initial values for the anode currents and the better is the result of the plating profile. That means that, without the usage of test wafers, it is possible to very quickly achieve a process recipe for achieving the intended results.

If there does not exist any data, the APC assumes initial values for the sensitivity matrix S. For instance, it may use the identity matrix as the sensitivity matrix. The first process run leads to particular deviations between the measured actual deposition profile and the deposition profile target. The APC now calculates a new sensitivity matrix based on the actual measured profile and the corresponding anode currents, for instance, by use of formula 12.

$$\begin{pmatrix} I_{r1} \\ I_{r2} \\ I_{r3} \end{pmatrix} \cdot (M_{r1}^{-1} \quad M_{r2}^{-1} \quad M_{r3}^{-1}) = \begin{pmatrix} I_{r1} \cdot M_{r1}^{-1} & I_{r1} \cdot M_{r2}^{-1} & I_{r1} \cdot M_{r3}^{-1} \\ I_{r2} \cdot M_{r1}^{-1} & I_{r2} \cdot M_{r2}^{-1} & I_{r2} \cdot M_{r3}^{-1} \\ I_{r3} \cdot M_{r1}^{-1} & I_{r3} \cdot M_{r2}^{-1} & I_{r3} \cdot M_{r3}^{-1} \end{pmatrix} \quad (12)$$

$$= \begin{pmatrix} S_{r1,1} & S_{r1,2} & S_{r1,3} \\ S_{r2,1} & S_{r2,2} & S_{r2,3} \\ S_{r3,1} & S_{r3,2} & S_{r3,3} \end{pmatrix}_{new}^{-1}$$

In formula 12, $I_{r1}$, $I_{r2}$ and $I_{r3}$ designate actual values for anode currents. $M_{r1}$, $M_{r2}$ and $M_{r3}$ designate the measured thicknesses of the copper at the anode locations r2, r2 and r3.

After the new inverse sensitivity matrix $S^{-1}$ has been calculated, a new set of anode current settings are calculated according to formula 13 and a new process run is carried out.

$$\begin{pmatrix} I_{r1} \\ I_{r2} \\ I_{r3} \end{pmatrix} \cdot t^{-1} = \begin{pmatrix} S_{r1,1} & S_{r1,2} & S_{r1,3} \\ S_{r2,1} & S_{r2,2} & S_{r2,3} \\ S_{r3,1} & S_{r3,2} & S_{r3,3} \end{pmatrix}_{new}^{-1} \cdot \begin{pmatrix} M_{r1} \\ M_{r2} \\ M_{r3} \end{pmatrix}_{target} \quad (13)$$

This method is carried out repeatedly until the difference between the target profile and the current measured profile does not exceed a certain value.

As soon as an appropriate matrix S for the sensitivity matrix has been found, it is implemented in the APC model together with the abovementioned parameters (pattern density, chamber characteristics, etc.). After several process recipes have been found for different layer product combinations that also include particular sensitivity matrixes, the APC will be in a state where initial settings for anode currents may be found very quickly by, for instance, interpolating initial parameters and corresponding initial sensitivity matrixes.

For instance, if there exists a process recipe for a wafer having a pattern density D1 and a pattern density D2 in the database as well as corresponding sensitivity matrixes, a possible starting point for a new process of a new product/layer combination may be to form a mean value between the matrix components relating to pattern density D1 and D2. Based on this new mean sensitivity matrix, respective initial settings for the anode currents may be calculated.

Thus, the described method leads to an automatic and self-sufficient process of plating targeting on given deposition and CMP equipment wherein manual shaping experiments may be avoided and which provides improved start settings of the plating tool. Further, this method allows a dynamic adjustment of process fluctuations and optimizes respective corrections.

The above model also allows calculating a virtual test wafer target and a virtual test wafer profile. To achieve this, formula 7 may be used to calculate virtual wafer profiles and virtual wafer targets by using an appropriate sensitivity matrix. A respective matrix could be obtained, for instance, by test wafer measurements which have to be carried out only one time to characterize equipment properties. Another possibility would be to interpolate data from the database to eliminate wafer influences from the sensitivity matrix. Thus, a theoretical profile on a test wafer may be calculated. By running test wafers, the APC model may be validated or, if necessary, corrected and updated. Moreover, calculating virtual test wafer data provides a user friendly set of data in order to judge the performance of the APC model.

It has to be understood that the above presented APC represents only an illustrative example and the disclosure should be not limited thereto. The person skilled in the art knows that other equivalent representations of the models are possible. For instance, collecting parameters and measurement data in an expert system which allows interpolation between data points and which has implemented decision rules is also possible. Alternatively, representing the data as polynomial or spline interpolated functions may be considered.

As a result, the present disclosure provides a technique which enables an automatic deposition profile targeting for electrochemically depositing copper with a multi-anode plating tool which is self-consistent and which does not require time-consuming test wafer runs. Further, this method allows dynamic compensation of process fluctuations and is able to reduce data efficiently and in a user friendly way.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of automatic deposition profile targeting for electrochemically depositing copper with a position-dependent controllable plating tool, comprising the steps of:
   receiving a first pattern density for wafers to be processed in the plating tool in a computing apparatus, wherein the wafers have a first product and layer combination;
   initializing a first sensitivity matrix for an advanced process control (APC) control model in the computing apparatus based on the first pattern density and a second sensitivity matrix associated with a second product and layer combination different from the first product and layer combination prior to operating the APC model on measurement data associated with wafers having the first product and layer combination, wherein the second product and layer combination has a second pattern density different than the first pattern density;

receiving measurement data in the computing apparatus representing an actual thickness profile of copper deposited on a patterned product wafer having the first product and layer combination;

feeding the measurement data to the APC model implemented by the computing apparatus; and calculating individual corrections for plating parameters in the position-dependent controllable plating tool in the computing apparatus using the APC model and the first sensitivity matrix, wherein the corrections are calculated based on a difference between the actual thickness profile and a deposition profile target.

2. The method of claim 1, wherein the advanced process control (APC) model further includes at least one of a model of a dependency between the deposition profile and chemical/mechanical polishing (CMP) tool characteristics and CMP tool history, a model of a dependency between the deposition profile and plating tool characteristics and chamber characteristics, and a model of a dependency between the deposition profile and a plating tool history and chamber history, wherein the advanced process control (APC) model predicts plating behavior based on these models.

3. The method of claim 1, wherein the model of the dependency between a deposition profile and underlying product wafer structures includes at least one of the following product parameters: etch depth, trench width, wafer stepping and material and crystal orientation of underlayer.

4. The method of claim 2, wherein the model of the dependency between a deposition profile and plating tool and chamber characteristics includes at least one of the following tool parameters: consumable status, hardware settings and chamber geometry.

5. The method of claim 1, further comprising calculating a virtual test wafer target and a virtual test wafer profile by use of a model implemented in the APC model describing a relation between an unpatterned test wafer and a patterned product wafer.

6. The method of claim 5, wherein the actual thickness profile comprises the virtual test wafer profile and the deposition profile target comprises the calculated virtual test wafer target.

7. The method of claim 1, wherein the corrections comprise at least one of position-dependent offsets or position-independent offsets.

8. The method of claim 7, further comprising:

repeatedly re-calculating and updating said APC model based on said corrections until the difference between the actual thickness profile and the deposition profile target is smaller than a predetermined value; and implementing a new set of model data including relevant process parameters selected from a set including at least one of pattern density, etch depth, trench width, wafer stepping, material and crystal orientation of underlayer, consumable status, hardware settings, or chamber geometry.

9. The method of claim 7, wherein the corrections comprise at least one of individual offsets or correction factors for each anode current of a multi-anode plating tool in a multi-anode electrochemical deposition apparatus.

10. The method of claim 1, wherein the APC model is in a continuously active mode to compensate for fluctuations within a production lot, and wherein corrections are applied to a subsequently processed wafer.

11. The method of claim 2, wherein the APC model is in a targeting mode to achieve a target profile in successively processed production lots, and wherein corrections are applied to a subsequently processed lot.

12. The method of claim 5, further comprising collecting data of calculated virtual test wafer targets and virtual test wafer profiles.

13. The method of claim 12, further comprising processing a test wafer, measuring a deposition profile, comparing the measured deposition profile with the virtual test wafer profiles and calculating test wafer-to-product response functions in order to adjust the model describing the relation between an unpatterned test wafer and the patterned product wafer.

14. The method of claim 13, further comprising validating the APC model by running a test wafer and comparing measured test wafer profiles with the calculated virtual test wafer profiles.

15. The method of claim 13, further comprising calculating from the collected data at least one of a layer-to-layer response function or a product-to-product response function.

16. The method of claim 1, wherein initializing the first sensitivity matrix comprises generating the first sensitivity matrix parameter based on the second sensitivity matrix and the first and second pattern densities.

17. The method of claim 1, wherein the second pattern density is less than the first pattern density, and initializing the sensitivity matrix comprises:

receiving a third sensitivity matrix associated with a third product and layer combination having a third pattern density greater than the first pattern density; and generating the first sensitivity matrix based on the second and third sensitivity matrices and the first, second, and third pattern densities.

* * * * *